(12) United States Patent
Yoshida et al.

(10) Patent No.: US 10,636,693 B2
(45) Date of Patent: Apr. 28, 2020

(54) SUBSTRATE TRANSFER DEVICE AND CONTROL METHOD THEREFOR

(71) Applicants: KAWASAKI JUKOGYO KABUSHIKI KAISHA, Kobe-shi, Hyogo (JP); KAWASAKI ROBOTICS (USA), INC., Wixom, MI (US)

(72) Inventors: Tetsuya Yoshida, Kakogawa (JP); Avish Ashok Bharwani, Santa Clara, CA (US); Ming Zeng, San Jose, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 46 days.

(21) Appl. No.: 16/127,460

(22) Filed: Sep. 11, 2018

(65) Prior Publication Data

US 2020/0083086 A1 Mar. 12, 2020

(51) Int. Cl.
*H01L 21/687* (2006.01)
*H01L 21/677* (2006.01)
*H01L 21/68* (2006.01)
*B25J 9/16* (2006.01)

(52) U.S. Cl.
CPC ...... *H01L 21/68707* (2013.01); *B25J 9/1612* (2013.01); *H01L 21/67766* (2013.01); *H01L 21/68* (2013.01)

(58) Field of Classification Search
CPC combination set(s) only.
See application file for complete search history.

(56) References Cited

U.S. PATENT DOCUMENTS

| | | | |
|---|---|---|---|
| 2002/0089655 A1* | 7/2002 | Kida | G03F 7/70691 355/72 |
| 2005/0078312 A1 | 4/2005 | Fukuzaki et al. | |
| 2008/0025824 A1 | 1/2008 | Hashimoto | |
| 2009/0252580 A1* | 10/2009 | Takizawa | H01L 21/681 414/222.02 |

(Continued)

FOREIGN PATENT DOCUMENTS

| | | |
|---|---|---|
| JP | 2003-152055 A | 5/2003 |
| JP | 2008-028134 A | 2/2008 |

(Continued)

*Primary Examiner* — Kyle O Logan
(74) *Attorney, Agent, or Firm* — Oliff PLC

(57) ABSTRACT

Throughput is improved in a substrate transfer device including a substrate transport robot having a substrate holding hand, and an aligner. A method of controlling a substrate transfer device includes moving a substrate holding hand holding a substrate to a predetermined ready position defined around an aligner, moving the substrate holding hand to a predetermined placement position defined by the aligner to transfer the substrate to a turntable of the aligner, causing the aligner to align the substrate while causing the substrate holding hand to wait at a predetermined waiting position defined at a position closer to the placement position than the ready position is, moving the substrate holding hand to the placement position to transfer the substrate from the aligner to the substrate holding hand, and moving the substrate holding hand holding the substrate to the ready position.

6 Claims, 5 Drawing Sheets

(56) References Cited

U.S. PATENT DOCUMENTS

2013/0195584 A1* 8/2013 Furuichi .................. B25J 9/042
    414/217
2017/0194187 A1* 7/2017 Xu .................... H01L 21/68707

FOREIGN PATENT DOCUMENTS

JP    2009-194346 A    8/2009
JP    2013-154453 A    8/2013

* cited by examiner

SUBSTRATE TRANSFER DEVICE AND CONTROL METHOD THEREFOR

BACKGROUND OF THE INVENTION

(1) Field of the Invention

The present invention relates to a substrate transfer device that transfers a substrate such as a semiconductor substrate or a glass substrate from a carrier to a processing device and a control method therefor.

(2) Description of Related Art

Conventionally, there has been known a substrate processing facility that performs processing such as an element formation on a semiconductor substrate (hereinafter, may be simply referred to as a "substrate") which is a semiconductor element manufacturing material. In general, a substrate processing facility includes a processing device, a substrate transfer device disposed adjacent to the processing device, and the like.

For example, the substrate transfer device described in JP 2008-28134 A includes a housing in which a transport chamber is formed, a plurality of load ports provided in a front wall of the housing, a substrate transport robot provided in the transport chamber, and an aligner. The substrate transport robot includes a robot arm and a robot hand connected to the wrist of the robot arm. The substrate transport robot performs an operation of such as loading and unloading a substrate to and from a processing device, and taking out and accommodating a substrate accommodated in a sealable substrate carrier for interprocess transport. Known examples of the substrate transfer device as described above include a front end module (Equipment Front End Module, abbreviated as EFEM) and a sorter. A known example of the substrate carrier as described above includes a so-called FOUP (Front Opening Unified Pod).

When performing processing such as gate formation on the substrate, respective substrates are required to be set on the processing stage under the condition that the position of the orientation flat cut out into a chord shape or the notch cut out into a V shape or a U shape is always aligned with the reference rotation position. Such alignment of the substrate is performed by the aligner. This type of aligner is disclosed in JP 2009-194346 A.

In the aligner of JP 2009-194346 A, first, when the robot hand on which the substrate is placed reaches above the turntable with the set height, the turntable rises to receive the substrate, and the turntable suctions the substrate by vacuum at the same time when the turntable stops at the upper limit position. Next, when the robot hand retracts and returns to a home position, the turntable (substrate) rotates by a specified angle. The turntable releases the vacuum suction after the line sensor measures the dimensions from the center to the end face before the rotation and at the time of stop.

As described in JP 2009-194346 A, the conventional robot hand of the substrate transfer device 1 is controlled such that after transferring the substrate to the aligner, the robot hand returns to the ready position once retracted from the aligner while the aligner aligns the substrate. After the alignment is completed, the robot hand moves from the ready position to the aligner to pick up the substrate. Thus, the operation of the robot hand includes a reciprocating motion without practical effects.

SUMMARY OF THE INVENTION

The present invention has been made in view of the above circumstances, and an object thereof is to improve throughput in a substrate transfer device including a substrate transport robot having a substrate holding hand, and an aligner.

A method of controlling a substrate transfer device according to one aspect of the present invention is a method of controlling a substrate transfer device including a substrate transport robot having a substrate holding hand, and an aligner, in which the method includes moving the substrate holding hand holding a substrate to a predetermined ready position defined around the aligner, moving the substrate holding hand to a predetermined placement position defined by the aligner to transfer the substrate to a turntable of the aligner, causing the aligner to align the substrate while causing the substrate holding hand to wait at a predetermined waiting position defined at a position closer to the placement position than the ready position is, moving the substrate holding hand to the placement position to transfer the substrate from the aligner to the substrate holding hand, and moving the substrate holding hand to the ready position.

A substrate transfer device according to one aspect of the present invention includes a substrate transport robot having a substrate holding hand, an aligner, and a controller including a memory storing a substrate transfer program and a processor that executes the substrate transfer program, in which the substrate transfer program causes the substrate transport robot to move the substrate holding hand holding a substrate to a predetermined ready position defined around the aligner, move the substrate holding hand to a predetermined placement position defined by the aligner to transfer the substrate to a turntable of the aligner, cause the substrate holding hand to wait, until alignment by the aligner is completed, at a predetermined waiting position defined at a position closer to the placement position than the ready position is, move the substrate holding hand to the placement position to transfer the substrate from the aligner to the substrate holding hand, and move the substrate holding hand to the ready position.

According to the substrate transfer device and the control method therefor, after the hand transfers the substrate to the aligner, the hand waits at the waiting position without returning to the home position until the alignment is completed. Therefore, the operation for the hand to move from the home position to the aligner to pick up the substrate is omitted, and the throughput of processing can be improved accordingly.

According to the present invention, it is possible to improve throughput in a substrate transfer device including a substrate transport robot having a substrate holding hand, and an aligner.

DETAILED DESCRIPTION OF PREFERRED EMBODIMENTS

[Schematic Configuration of Substrate Processing Facility 100]

Figure 1:
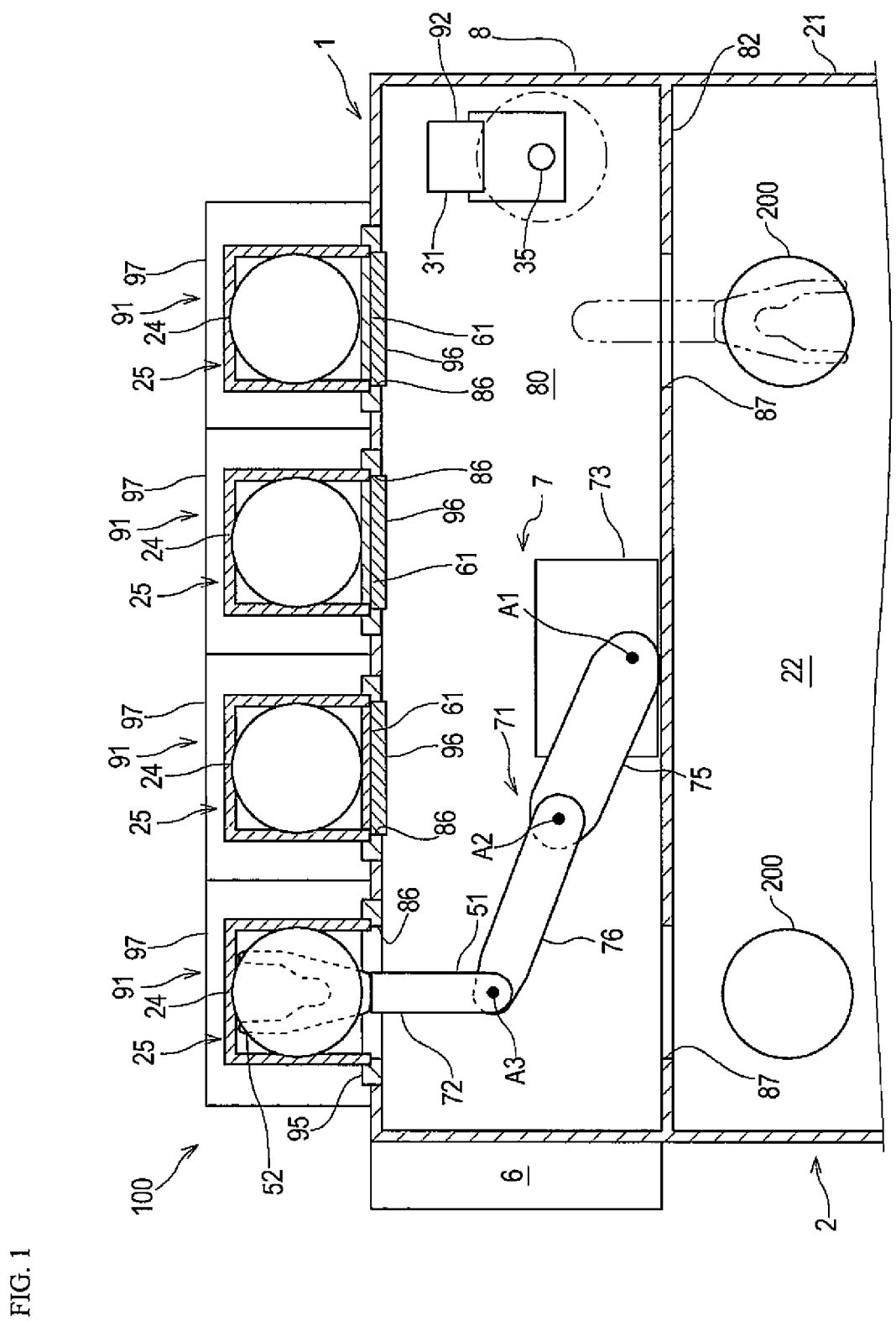
FIG. 1 is a plan cross-sectional view showing a schematic configuration of a substrate processing facility including a substrate transfer device according to an embodiment of the present invention.
Figure 2:
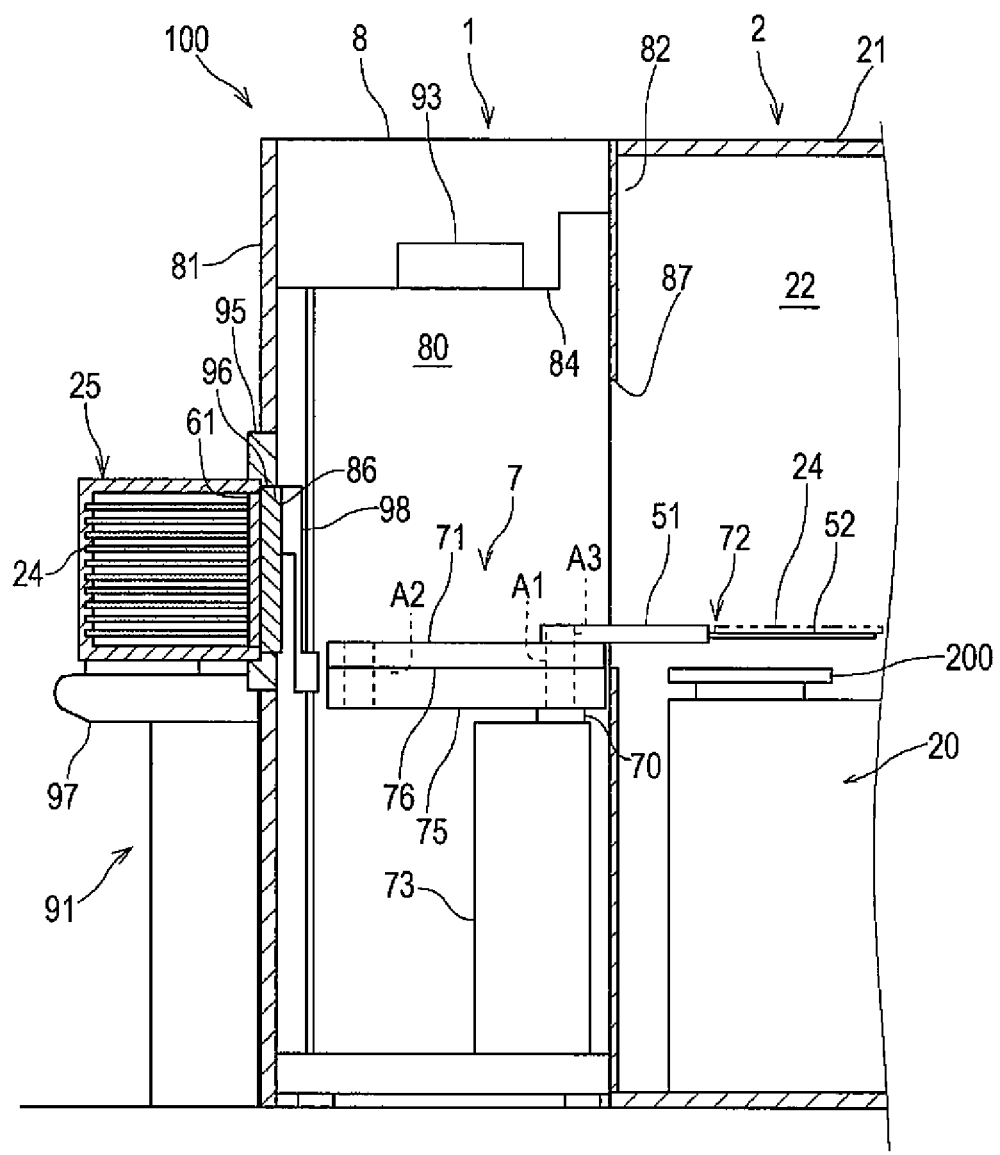
FIG. 2 is a side cross-sectional view showing a schematic configuration of the substrate processing facility shown in FIG. 1.

First, a schematic configuration of a substrate processing facility 100 including a substrate transfer device 1 according to an embodiment of the present invention will be described. FIG. 1 is a plan sectional view showing a schematic configuration of the substrate processing facility 100 including the substrate transfer device 1 according to an embodiment of the present invention, and FIG. 2 is a side cross-sectional view showing a schematic configuration of the substrate processing facility 100 shown in FIG. 1. As shown in FIGS. 1 and 2, the substrate processing facility 100 includes the substrate transfer device 1 and a processing device 2. The substrate processing facility 100 is designed to conform to the SEMI (Semiconductor Equipment and Materials International) standard, for example.

The processing device 2 is a device or a group of devices that performs at least one or more kinds of processing of a heat treatment, an impurity introduction process, a thin film formation process, a lithography process, a cleaning process, and a planarization process on a substrate 24. However, the processing device 2 may perform processing other than the above-described processing on the substrate 24.

The processing device 2 includes a processing device main body 20 that performs processing on the substrate 24, a housing 21 that accommodates the processing device main body 20, and an adjustment device that adjusts atmospheric gases in a processing chamber 22 formed in the housing 21 (not shown). The adjustment device may be realized by, for example, a fan filter unit or the like.

The substrate transfer device 1 is disposed adjacent to the processing device 2. The substrate transfer device 1 functions as an interface unit responsible for delivery of the substrate 24 between a substrate carrier 25 and the processing device 2. The substrate carrier 25 is a portable container that can accommodate a large number of substrates 24.

[Configuration of Substrate Transfer Device 1]

Next, the configuration of the substrate transfer device 1 will be described in detail. The substrate transfer device 1 includes: a substrate transport robot 7; an aligner 92 for aligning an orientation of the substrate 24; an adjustment device 93; a housing 8 that accommodates the substrate transport robot 7, the aligner 92, and the adjustment device 93; a load port 91; and a controller 6.

The housing 8 has a rectangular parallelepiped shape in which a front wall 81 and a rear wall 82 have the largest area, and a transport chamber 80 is formed inside the housing 8. The transport chamber 80 is a closed space having a high degree of cleanliness, and the transport chamber 80 is filled with a predetermined atmospheric gas. The adjustment device 93 controls such that floating fine particles in the atmosphere of the transport chamber 80 are below a predetermined cleanliness level, and environmental conditions of the transport chamber 80 such as temperature, humidity, pressure, and the like are also managed as necessary.

A plurality of rear openings 87 are provided on the rear wall 82 of the housing 8. The rear wall 82 partitions the processing chamber 22 of the processing device 2 and the transport chamber 80 of the substrate transfer device 1, and the processing chamber 22 and the transport chamber 80 communicate with each other through the rear openings 87.

A plurality of load ports 91 are provided on the front wall 81 of the housing 8. The load port 91 has functions such as docking and undocking of the substrate carrier 25 and the substrate transfer device 1, support of the substrate carrier 25, and opening and closing of the substrate carrier 25.

The load port 91 includes an opening frame 95, a support base 97, and an opener 98. The opening frame 95 constitutes a part of the front wall 81 of the housing 8, and a front opening 86 of the housing 8 is defined by the opening frame 95. The opener 98 integrally moves a container side door 61 and an opener side door 96 of the substrate carrier 25 into the transport chamber 80, thereby opening the front opening 86. The substrate carrier 25 is placed on the support base 97. Through the front opening 86 formed in the front wall 81 of the housing 8, the substrate carrier 25 docked with the substrate transfer device 1, and the transport chamber 80 communicate with each other.

The aligner 92 includes a line sensor 31 and a turntable 35. A turntable 5 has a vertical axis of rotation and is rotationally driven about the axis of rotation in a horizontal plane by a rotary driving device 37 (see FIG. 3). The turntable 35 includes a vacuum chuck driven by a vacuum (not shown), whereby the substrate 24 is held on the turntable 35 by suction.

The substrate transport robot 7 includes a robot arm (hereinafter simply referred to as an "arm 71"), a substrate holding hand (hereinafter simply referred to as a hand 72) which is an example of an end effecter connected to a wrist portion of the arm 71, and a base 73 that supports the arm 71. The substrate transport robot 7 according to the present embodiment is a horizontal articulated robot.

The arm 71 includes an elevation shaft 70 supported by the base 73 and a plurality of links 75 and 76 connected to each other. A proximal end of the first link 75 and a distal end of the elevation shaft 70 are connected via a first joint A1. A distal end of the first link 75 and a proximal end of the second link 76 are connected via a second joint A2. The distal end of the second link 76 and the proximal end of the hand 72 are connected via a wrist joint A3. An elevation driving device 69 that raises and lowers the elevation shaft 70 is provided in the base 73 (see FIG. 3). The elevation driving device 69 includes, for example, a servomotor that is angularly displaced in accordance with a signal given from the controller 6, a power transmission mechanism including a deceleration device to convert power of the servomotor into a straightforward force and transmit the force to the elevation shaft 70, and a position detector that detects the angular displacement of the servomotor (all of which are not shown). A first joint driving device 77 that drives the first joint A1 and a second joint driving device 78 that drives the second joint A2 are provided inside the first link 75 (see FIG. 3). A wrist joint driving device 79 that drives the wrist joint A3 is provided in the second link 76 (see FIG. 3). Each of the joint driving devices 77, 78, and 79 includes a servomotor angularly displaced in accordance with a signal given from the controller 6, a power transmission mechanism including a deceleration device for transmitting power of the servomotor to the link body, and a position detector that detects the angular displacement of the servomotor (all of which are not shown).

The hand 72 includes a hand base 51 connected to the distal end of the arm 71 via the wrist joint A3 and a blade 52 coupled to the hand base 51. The blade 52 includes a holding device for holding the substrate 24. The holding device may be configured such that the substrate 24 placed on the blade 52 does not fall off from the blade 52 in the form of fitting, suction, clamping, or the like.

[Configuration of Control System of Substrate Transfer Device 1]

Figure 3:
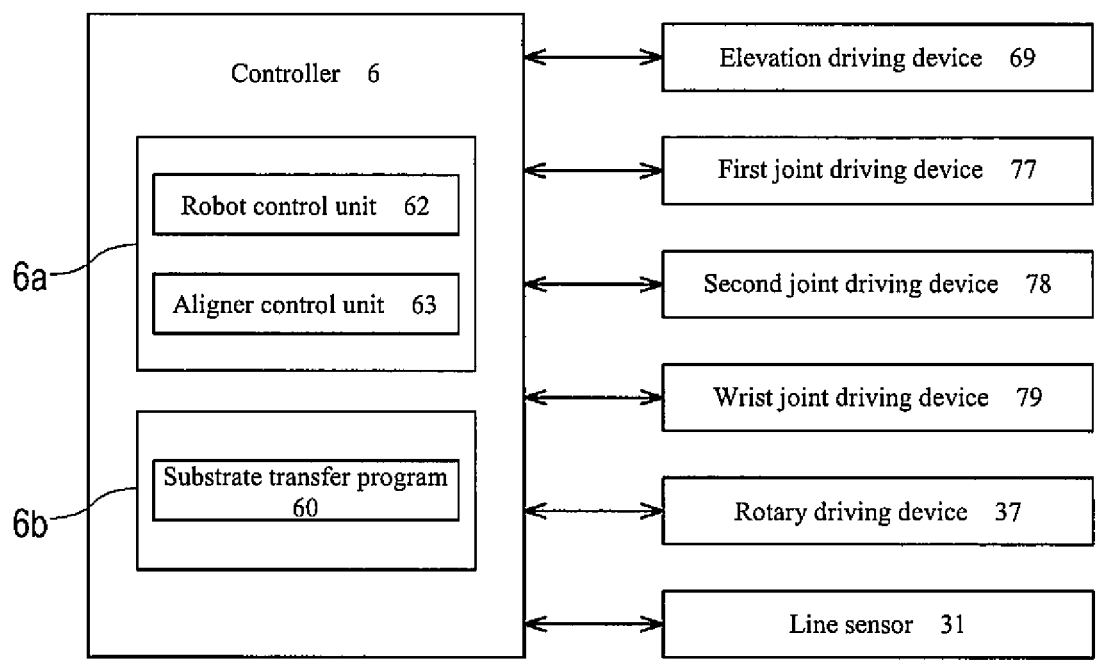
FIG. 3 is a block diagram showing a configuration of a control system of the substrate transfer device.

FIG. 3 is a block diagram showing a configuration of a control system of the substrate transfer device 1. The controller 6 includes a robot control unit 62 and an aligner control unit 63. The controller 6 is a so-called computer, and includes, for example, a processor 6a such as a microcontroller, a CPU, an MPU, a PLC, a DSP, an ASIC, or an FPGA, and a memory 6b such as a ROM and a RAM. The memory 6b stores a program executed by the processor 6a including a substrate transfer program 60. The memory 6b stores data and the like used for processing executed by the processor 6a. In the controller 6, the processor 6a reads and executes software such as a program stored in the memory 6b, so that processing for functioning as the robot control unit 62 and the aligner control unit 63 is performed. Note that the controller 6 may execute each processing by centralized control by a single computer or each processing may be executed by distributed control by cooperation of a plurality of computers.

The robot control unit 62 of the controller 6 controls the operation of the substrate transport robot 7. More specifically, the robot control unit 62 is electrically connected to the elevation driving device 69, the first joint driving device 77, the second joint driving device 78, and the wrist joint driving device 79. The robot control unit 62 acquires the rotational position of the servomotor from the position detector included in these driving devices, and calculates a target pose based on a pose (position and attitude) of the hand 72 corresponding to the rotational position and the stored teaching point data. Further, the robot control unit 62 outputs a control command to the servo amplifier so that the hand 72 is positioned in the target pose. A servo amplifier supplies driving power to each servomotor based on a control command, whereby the hand 72 moves to the target pose.

The aligner control unit 63 of the controller 6 controls the operation of the aligner 92. More specifically, the aligner control unit 63 is electrically connected to the line sensor 31 and the rotary driving device 37 of the turntable 35, and controls the operation thereof.

[Operation of Substrate Transfer Device 1]

Here, the operation of the substrate transfer device 1 having the above configuration will be described. In the substrate transfer device 1, the substrate transport robot 7 transports the substrate 24 from the substrate carrier 25 to the transport chamber 80, the aligner 92 identifies the center position and direction of the substrate 24, and then the substrate transport robot 7 transports the substrate 24 to the processing chamber 22.

Figure 4:
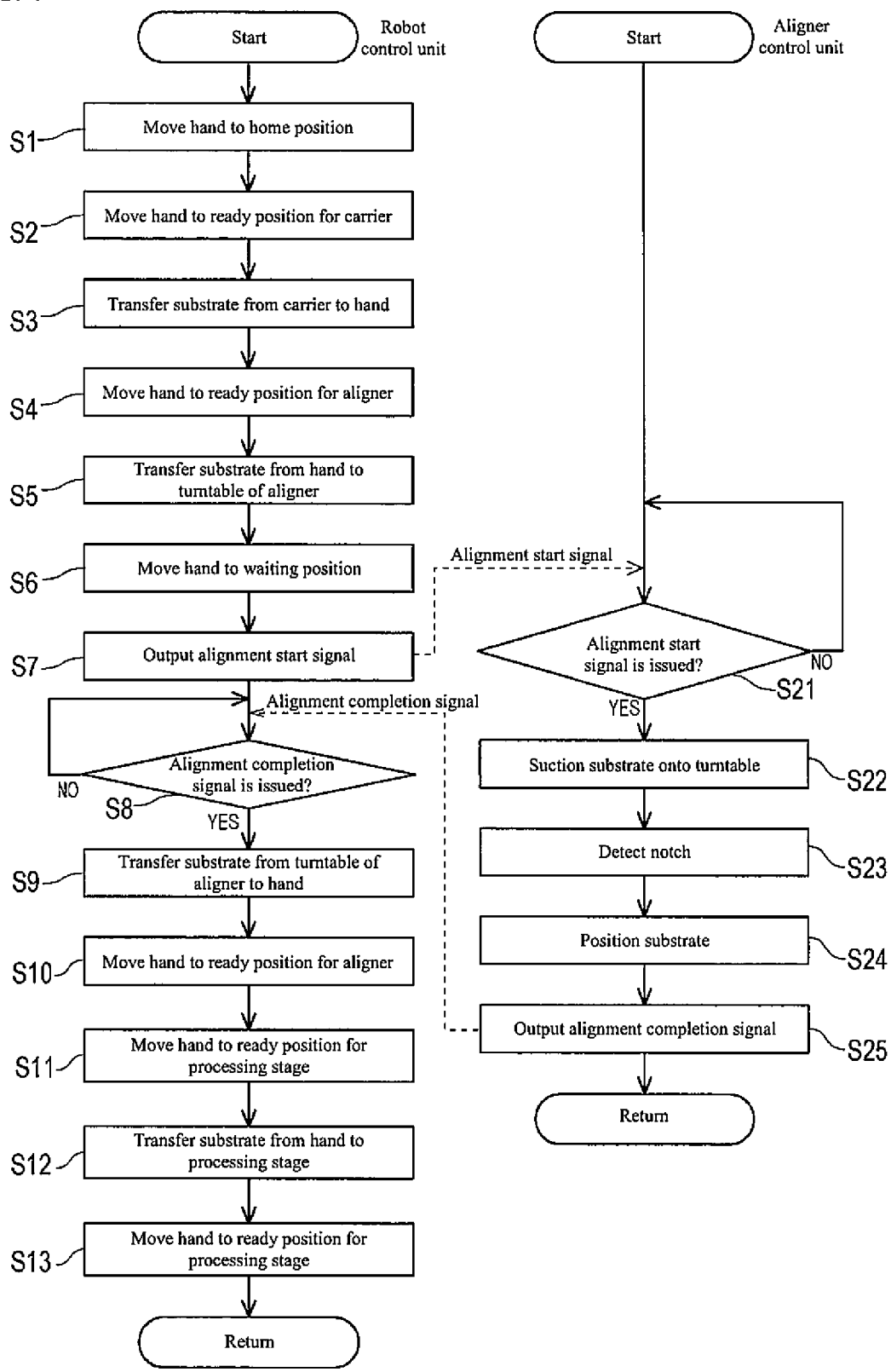
FIG. 4 is a flowchart for describing a flow of processing by the controller.
Figure 5:
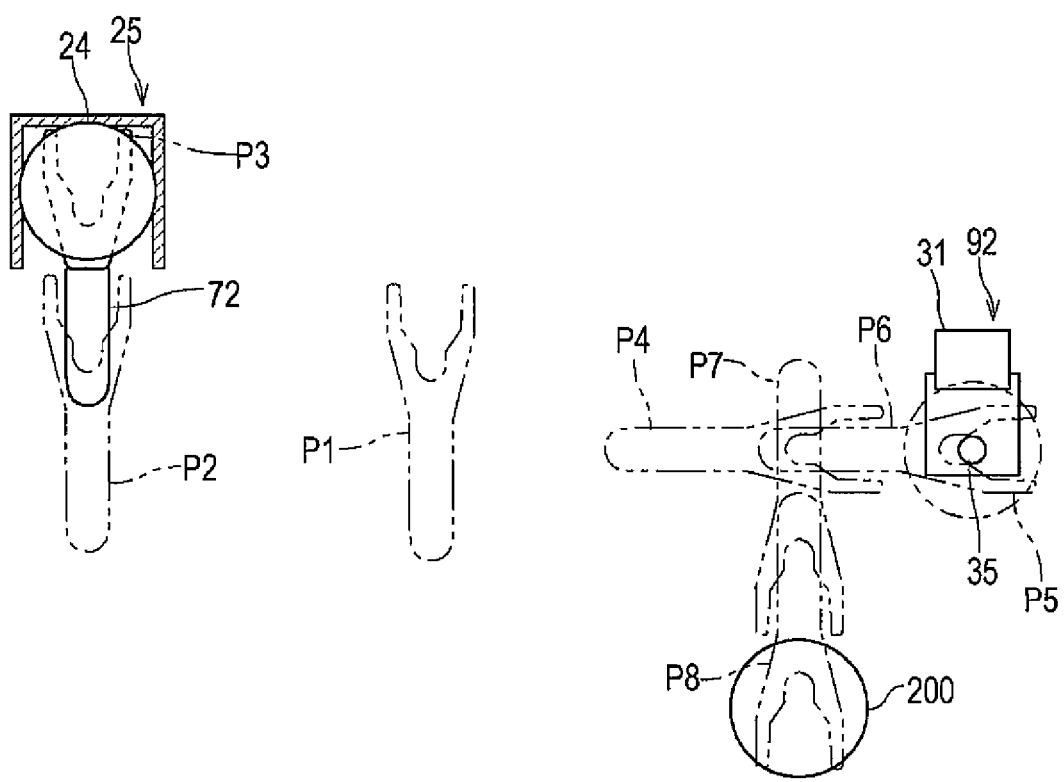
FIG. 5 is a diagram for describing a target position of a hand movement.

FIG. 4 is a flowchart for describing a flow of processing by the controller 6. In FIG. 4, the system on the left side in the plane of FIG. 4 represents the flow of processing of the robot control unit 62, and the system on the right side in the plane of FIG. 4 represents the flow of processing of the aligner control unit 63. FIG. 5 is a view for describing the target positions P1 to P8 of the movement of the hand 72. The coordinates (robot coordinates) of the target positions P1 to P8 are stored in the controller 6 in advance.

As shown in FIGS. 4 and 5, first, the robot control unit 62 operates the substrate transport robot 7 so that the substrate transport robot 7 moves the hand 72 to a predetermined home position P1 (step S1). Subsequently, the robot control unit 62 operates the substrate transport robot 7 so that the substrate transport robot 7 moves the hand 72 to a ready position P2 for the substrate carrier 25 (step S2). When the hand 72 reaches the ready position P2, the robot control unit 62 operates a substrate transport robot 7 so that the substrate transport robot 7 transfers the substrate 24 from the substrate carrier 25 to the hand 72 (step S3). Here, the hand 72 moves to a substrate transfer position P3 of the substrate carrier 25, ascends slightly, receives the substrate 24 from the substrate carrier 25, and returns to the ready position P2.

When the hand 72 receives the substrate 24, the robot control unit 62 operates the substrate transport robot 7 so that the substrate transport robot 7 moves the hand 72 to a predetermined ready position P4 for the aligner 92 (step S4). The ready position P4 for the aligner 92 is defined as a position retracted in the horizontal direction from the turntable 35 of the aligner 92. The hand 72 at the ready position P4 does not overlap with the aligner 92 in plan view and is sufficiently separated from the aligner 92 to such an extent that it does not interfere with the aligner 92 even if deformation of the hand 72 or displacement of the control position of the hand 72 occurs.

When the hand 72 reaches the ready position P4, the robot control unit 62 operates the substrate transport robot 7 so that the substrate transport robot 7 transfers the substrate 24 from the hand 72 to the turntable 35 of the aligner 92 (step S5). Here, the hand 72 is moved to a placement position P5 defined by the aligner 92 so that the substrate 24 held by the hand 72 may access a location above the turntable 35 of the aligner 92, and subsequently the hand 72 is slightly lowered from the placement position P5.

Next, the robot control unit 62 operates the substrate transport robot 7 so that the substrate transport robot 7 moves the hand 72 to a predetermined waiting position P6 (step S6). Here, the waiting position P6 is located closer to the placement position P5 than the ready position P4 is. For example, the waiting position P6 may be located below the placement position P5. Further, for example, when the substrate 24 is held on the lower surface of the hand 72, the waiting position P6 may be located above the placement position P5. Further, for example, the waiting position P6 may be located between the placement position P5 and the ready position P4.

When the hand 72 moves to the waiting position P6 as described above, the robot control unit 62 issues an alignment start signal to the aligner control unit 63 (step S7).

Upon receiving the alignment start signal (YES in step S21), the aligner control unit 63 holds the substrate 24 placed on the turntable 35 by suction (step S22). Subsequently, the aligner control unit 63 operates the rotary driving device 37 and the line sensor 31 so as to cause the line sensor 31 to detect the notch of the substrate 24 while rotating the substrate 24 supported by the turntable 35 (step S23). The aligner control unit 63 operates the rotary driving device 37 so that the substrate 24 is positioned at a predetermined rotational position by using the detected notch (step S24). When the substrate 24 is positioned, the aligner control unit 63 issues an alignment completion signal to the robot control unit 62 (step S25).

Upon receipt of the alignment completion signal (YES in step S8), the robot control unit 62 operates the substrate transport robot 7 (step S9) so that the substrate transport robot 7 transfers the substrate 24 from the turntable 35 to the hand 72. Here, the hand 72 moves downward from the waiting position P6 to a position below the substrate 24, slightly ascends from this position, and moves to a transfer position P5.

When the substrate 24 is transferred to the hand 72, the robot control unit 62 operates the substrate transport robot 7 so that the substrate transport robot 7 moves the hand 72 to the ready position P4 for the aligner 92 (step S10).

The robot control unit 62 operates the substrate transport robot 7 so that the substrate transport robot 7 moves the hand 72 to a ready position P7 defined with respect to a processing stage 220 in order to allow the substrate 24 held by the hand 72 to access the processing stage 220 of the processing chamber 22 (step S11). The ready position P7 is defined in front of the rear openings 87 in the transport chamber 80.

When the hand 72 reaches the ready position P7, the robot control unit 62 operates the substrate transport robot 7 so that the substrate transport robot 7 transfers the substrate 24 from the hand 72 to the processing stage 220 (step S12). Here, the hand 72 moves from the ready position P7 to a placement position P8 prescribed for the processing stage 220, and is lowered therefrom to place the substrate 24 on the processing stage 220. Finally, the robot control unit 62 operates the substrate transport robot 7 so that the substrate transport robot 7 moves the hand 72 to the ready position P7 (step S13), and returns the processing to step S1 and repeats the processing.

In the above series of processing steps, the transfer of the substrate 24 from the hand 72 to the turntable 35 (step S5), the movement of the hand 72 to the waiting position P6 (step S6), the transfer of the substrate 24 from the turntable 35 to the hand 72 (step S9) and the movement of the hand 72 to the ready position P4 (step S10) are programmed as a single sequence, and no other command is input during the performance of this sequence. In other words, one command is associated with the above sequence. When the robot control unit 62 executes one command, the transfer of the substrate 24 from the hand 72 to the turntable 35 (step S5), the movement of the hand 72 to the waiting position P6 (step S6), the transfer of the substrate 24 from the turntable 35 to the hand 72 (step S9), and the movement of the hand 72 to the ready position P4 (step S10) are continuously performed.

According to the flow of the above series of processing steps, after the hand 72 transfers the substrate 24 to the turntable 35 of the aligner 92, the hand 72 waits at a waiting position P5 defined by the aligner 92 without returning to the ready position P4 defined for the aligner 92 until an alignment completion signal is issued.

As described above, the substrate transfer device 1 of the present embodiment includes the substrate transport robot 7 having the substrate holding hand 72, the aligner 92, the memory 6b storing the substrate transfer program 60, and the processor 6a that executes the substrate transfer program 60. The substrate transfer program 60 causes the substrate transport robot 7 to move the substrate holding hand 72 holding the substrate 24 to the predetermined ready position P4 defined around the aligner 92, move the substrate holding hand 72 to the predetermined placement position P5 defined by the aligner 92 to transfer the substrate 24 to the turntable of the aligner 92, cause the substrate holding hand 72 to wait until alignment by the aligner 92 is completed at the predetermined waiting position P6 defined at a position closer to the placement position P5 than the ready position P4 is, move the substrate holding hand 72 to the placement position P5 to transfer the substrate from the aligner to the substrate holding hand, and move the substrate holding hand 72 to the ready position P4.

Further, the method of controlling the substrate transfer device 1 of the present embodiment includes moving the substrate holding hand 72 holding the substrate 24 to the predetermined ready position P4 defined around the aligner 92, moving the substrate holding hand 72 to the predetermined placement position P5 defined by the aligner 92 to transfer the substrate 24 to the turntable 35 of the aligner 92, causing the aligner 92 to align the substrate 24 while causing the substrate holding hand 72 to wait at the predetermined waiting position P6 defined at a position closer to the placement position P5 than the ready position P4 is, moving the substrate holding hand 72 to the placement position P5 to transfer the substrate 24 from the aligner 92 to the substrate holding hand 72, and moving the substrate holding hand 72 holding the substrate 24 to the ready position P4.

According to the substrate transfer device 1 and the control method therefor, after the hand 72 transfers the substrate 24 to the aligner 92, the hand 72 waits until alignment is completed at the waiting position P6 without returning to the ready position P4. Therefore, the operation for the hand 72 to move from the ready position P4 to the aligner 92 to pick up the substrate 24 is omitted, and the throughput of processing can be improved accordingly. Also, since the hand 72 is stationary during the alignment of the substrate 24, the alignment of the substrate 24 is not affected by the vibration from the substrate transport robot 7.

In the substrate transfer device 1 and the control method therefor, as described in the present embodiment, the waiting position P6 of the hand 72 may be located below or above the substrate 24 held by the aligner 92.

Since the hand 72 waits at the waiting position P6 until the alignment is completed, the moving distance of the hand 72 when transferring the substrate 24 from the aligner 92 to the hand 72 after the alignment is completed becomes the shortest, and the throughput of processing can be improved accordingly.

In the substrate transfer device 1 and the control method therefor, as described in the present embodiment, the waiting position P6 of the hand 72 may be located between the placement position P5 and the ready position P4.

Therefore, the operation of the hand 72 returning from the placement position P5 of the aligner 92 to the ready position P4 and the operation of the hand 72 returning from the ready position P4 to the placement position P5 are omitted. Instead of these operations, the operation of the aligner 92 going from the placement position P5 to the waiting position P6 and the operation of the aligner 92 returning to the waiting position P6 and the placement position P5 are added. However, the distance between the placement position P5 and the waiting position P6 is shorter than the distance between the placement position P5 and the ready position P4, thereby reducing the operation time.

Although the preferred embodiments of the present invention have been described above, it is also possible to include modifications of the specific structure and/or function of the above embodiment in detail without departing from the spirit of the present invention.

What is claimed is:

1. A method of controlling a substrate transfer device including a substrate transport robot having a substrate holding hand and an aligner, the method comprising:
   moving the substrate holding hand holding a substrate to a predetermined ready position defined around the aligner;
   moving the substrate holding hand to a predetermined placement position defined by the aligner to transfer the substrate to a turntable of the aligner;
   causing the aligner to align the substrate while causing the substrate holding hand to wait at a predetermined waiting position defined at a position closer to the placement position than the ready position is;
   moving the substrate holding hand to the placement position to transfer the substrate from the aligner to the substrate holding hand; and moving the substrate holding hand holding the substrate to the ready position.

2. The method of controlling a substrate transfer device according to claim 1, wherein the waiting position is located below or above the substrate held by the aligner.

3. The method of controlling a substrate transfer device according to claim 1, wherein the waiting position is located between the placement position and the ready position.

4. A substrate transfer device comprising:
- a substrate transport robot having a substrate holding hand;
- an aligner; and
- a controller including a memory storing a substrate transfer program and a processor that executes the substrate transfer program,
- wherein the substrate transfer program causes the substrate transport robot to move the substrate holding hand holding a substrate to a predetermined ready position defined around the aligner,
- move the substrate holding hand to a predetermined placement position defined by the aligner to transfer the substrate to a turntable of the aligner,
- cause the substrate holding hand to wait, until alignment by the aligner is completed, at a predetermined waiting position defined at a position closer to the placement position than the ready position is,
- move the substrate holding hand to the placement position to transfer the substrate from the aligner to the substrate holding hand, and
- move the substrate holding hand to the ready position.

5. The substrate transfer device according to claim 4, wherein the waiting position is located below or above the substrate held by the aligner.

6. The substrate transfer device according to claim 4, wherein the waiting position is located between the placement position and the ready position.

* * * * *